United States Patent [19]

Nakajima et al.

[11] Patent Number: 4,931,409
[45] Date of Patent: Jun. 5, 1990

[54] METHOD OF MANUFACTURING SEMICONDUCTOR DEVICE HAVING TRENCH ISOLATION

[75] Inventors: Hiroomi Nakajima, Yokohama; Nobuyuki Itoh, Tokyo; Hiroyuki Nihira, Ayase, all of Japan

[73] Assignee: Kabushiki Kaisha Toshiba, Kawasaki, Japan

[21] Appl. No.: 302,915

[22] Filed: Jan. 30, 1989

[30] Foreign Application Priority Data

Jan. 30, 1988 [JP] Japan .................. 63-20298
Mar. 31, 1988 [JP] Japan .................. 63-78748

[51] Int. Cl.⁵ .................. H01L 21/76; H01L 21/302
[52] U.S. Cl. .................. 437/63; 437/67
[58] Field of Search .................. 437/38, 67, 63, 64

[56] References Cited

U.S. PATENT DOCUMENTS

| | | | |
|---|---|---|---|
| 4,471,525 | 9/1984 | Sasaki | 437/63 |
| 4,493,740 | 1/1985 | Komeda | 437/63 |
| 4,519,128 | 5/1985 | Chesebro | 437/63 |
| 4,534,824 | 8/1985 | Chen | 437/63 |
| 4,660,278 | 4/1987 | Teng | 437/63 |
| 4,693,781 | 9/1987 | Leung et al. | 156/643 |
| 4,703,554 | 11/1987 | Havemann | 437/63 |
| 4,766,090 | 8/1988 | Coquin | 437/63 |

FOREIGN PATENT DOCUMENTS

| | | | |
|---|---|---|---|
| 66042 | 12/1982 | European Pat. Off. | 437/63 |
| 88584 | 5/1978 | Japan | 437/63 |
| 62-12660 | 3/1987 | Japan | . |
| 62-298110 | 12/1987 | Japan | 437/38 |
| 63-99563 | 4/1988 | Japan | 437/67 |
| 63-114158 | 5/1988 | Japan | 437/67 |
| 63-287024 | 11/1988 | Japan | 437/67 |
| 2207281 | 1/1989 | United Kingdom | 437/67 |

OTHER PUBLICATIONS

Solid State Technology, Apr. 1983, pp. 135–139, "Plasma Deposition of Inorganic Films"; A. C. Adams; 1983.

Primary Examiner—Olik Chaudhuri
Attorney, Agent, or Firm—Oblon, Spivak, McClelland, Maier & Neustadt

[57] ABSTRACT

A method of manufacturing a semiconductor device comprising steps of forming a trench on a semiconductor substrate, forming a first film on the surface of the semiconductor substrate so as to have a large thickness on an upper portion of a side surface of the trench, and to have a small thickness on a bottom portion of the trench, selectively doping an impurity in the bottom portion of the trench through a thin portion of the first film formed on the bottom portion of the trench to form an impurity region on the bottom portion of the trench, removing the first film, and forming a second film having an insulating property on the surface of the semiconductor substrate. A dielectric material or conductive material layer is formed in the trench in which the second film is formed on the inner surface. When the dielectric material or the conductive material layer is formed in the trench, a method of this invention can be applied to formation of trench isolation. When the conductive material layer is formed in the trench, this method can be applied formation of a trench capacitor.

19 Claims, 7 Drawing Sheets

METHOD OF MANUFACTURING SEMICONDUCTOR DEVICE HAVING TRENCH ISOLATION

BACKGROUND OF THE INVENTION

1. Field of the Invention

The present invention relates to a method of manufacturing a semiconductor device and, more particularly, to an improvement of trench isolation.

2. Description of the Related Art

In a semiconductor integrated circuit, an element isolation technique is very important in view of degree of integration, and circuit characteristics. In conventional p-n junction isolation generally performed for a bipolar integrated circuit, an area of an isolation region and a parasitic capacitance are undesirably increased.

On the contrary, a trench isolation structure in which a trench is formed in a semiconductor substrate, and a dielectric material is buried therein is recently proposed. In this isolation structure, it is necessary that an impurity layer for preventing inversion is formed in a bottom portion of the trench to prevent decrease in leakage and breakdown voltage between elements. In this case, an impurity may be doped not only in the bottom portion of the trench but also in side walls of the trench. Therefore, since elements are adversely affected, this disadvantage must be eliminated.

Figure 1A:
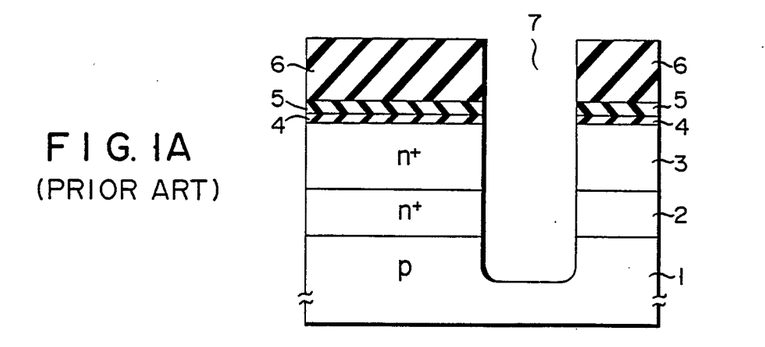
Figs 1A to 1C are sectional views showing a conventional element isolation process.
Figure 1B:
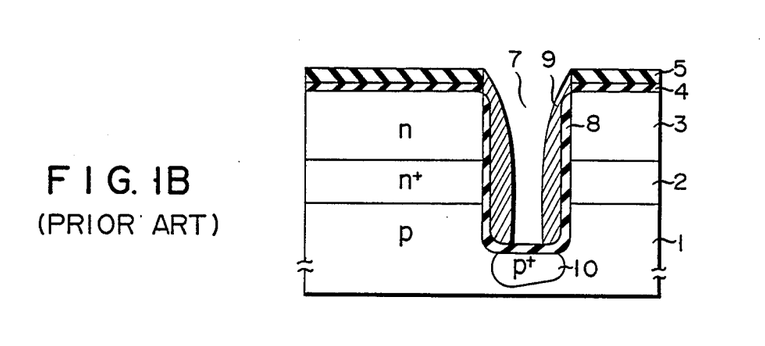
Figure 1C:
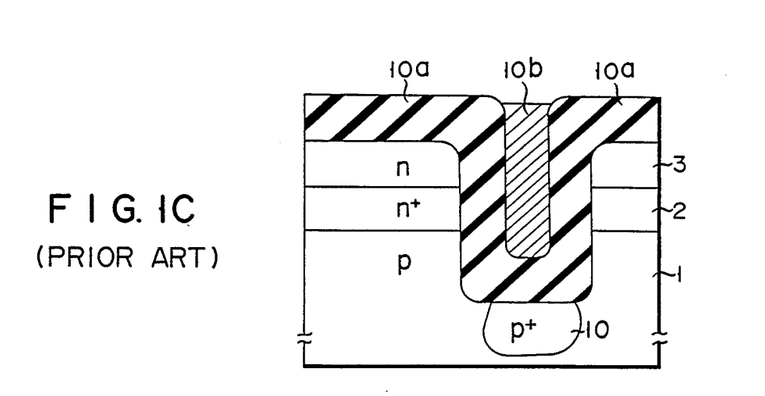

FIGS. 1A to 1C show steps in manufacturing a conventional trench isolation structure in consideration of the above points.

Referring to FIG. 1A, n+-type buried layer 2 is formed on p-type Si substrate 1. Then, n-type layer 3 is epitaxially grown to obtain a semiconductor wafer. This wafer is thermally oxidized to form $SiO_2$ film 4, and $Si_3N_4$ film 5 is deposited thereon by CVD (chemical vapor deposition). Thick $SiO_2$ film 6 is formed on film 5 by CVD. Then, an opening for forming a trench is formed in $SiO_2$ film 6 using a photoresist mask (not shown). Selective ion etching is performed using $SiO_2$ film 6 as a mask by reactive ion etching to form trench 7. In reactive ion etching, a polymer is attached to an inner surface of trench 7. However, this polymer is removed by an aqueous solution of $NH_4F$.

Referring to FIG. 1B, $SiO_2$ film 8 having a thickness of about 250 Å is formed on the inner surface of trench 7 by thermal oxidation. After polycrystalline silicon is deposited, reactive ion etching is performed on the entire surface of film 8 and polycrystalline silicon film 9 remains on the side walls of trench 7. Boron ions are implanted in a bottom portion of trench 7 to form p+-layer 10 serving as an inversion preventive layer. In this ion implantation, by using $Si_3N_4$ film 5 and polycrystalline silicon film 9 as masks, p+-layer 10 is selectively formed on only the bottom portion of trench 7.

After $Si_3N_4$ film 5 and polycrystalline silicon film 9 are removed, as shown in FIG. 1C, $SiO_2$ film 10a is formed on the entire surface of the wafer including an inner space of the trench by thermal oxidation. Then, polycrystalline silicon layer 10b serving as a dielectric material layer is buried in trench 7. The surface of polycrystalline silicon layer 10b is finally covered with a thermal oxide film (not shown) to complete the trench isolation.

In this conventional method of forming a trench isolation, in order to selectively implant an impurity only on the bottom portion of trench 7, the following operations are necessary, that is, a process for forming $SiO_2$ film 4 formed by thermal oxidation and $Si_3N_4$ film 5 as a mask on the wafer, and a process for forming $SiO_2$ film 8 on the side walls of the trench. However, large stress is concentrated at on the upper corners of trench 7 due to differences in viscosity and thermal expansion coefficient between $Si_3N_4$ film 5 $SiO_2$ film 4 and between $Si_3N_4$ film 5 and the $SiO_2$ film 6. Since the concentration of the stress causes dislocation, it is difficult that $SiO_2$ film 8 formed on the side walls of the trench has a thickness, of e.g., about 1,000 Å by thermal oxidation. Therefore, as described above, the thickness of $SiO_2$ film 8 is about 250 Å, and polycrystalline silicon film 9 is selectively formed on the side walls of film 8. However, this method undesirably complicates the process.

In the conventional arrangement as described above, it is considered that an $SiO_2$ film is formed in place of $Si_3N_4$ film 5. By this formation, although concentration of the stress can be eliminated to some extent, it is not satisfactory. Since the thermal oxide film is grown while extending under the thick CVD $SiO_2$ film, dislocation also occurs in thermal oxidation.

In the conventional method, a polymer removal process by $NH_4F$ is performed after the trench is formed. At this time, an $SiO_2$ film is side-etched to expose a substrate on the corner portions. As a result, in the following ion implantation steps, an unnecessary p-type inversion layer is undesirably formed in an element region, thereby increasing a leak current of the element, and decreasing a breakdown voltage.

SUMMARY OF THE INVENTION

It is an object of the present invention to provide a method of manufacturing a semiconductor device which controls dislocation caused by concentration of stress at corner portions of a trench, thereby preventing an increase in leak current of an element and a decrease in breakdown voltage.

It is another object of the present invention to provide a method of manufacturing a semiconductor device which prevents doping of an impurity in side walls of a trench by a simple process when an inversion preventive layer is formed by doping of the impurity in a bottom portion of the trench, thereby preventing an increase in leak current of an element and a decrease in breakdown voltage.

According to a first embodiment of the present invention, there is provided a method of manufacturing a semiconductor device, comprising the steps of forming a trench in a semiconductor substrate, forming a first film on the surface of the semiconductor substrate including an inner surface of the trench so as to have a large thickness on an upper portion of a side surface of he trench and to have a small thickness on a bottom portion of the trench, selectively doping an impurity in the bottom portion of the trench through a thin portion of the first film formed on the bottom portion of the trench to form an impurity region on the bottom portion of the trench, removing the first film, and forming a second film having an insulating property on the surface of the semiconductor substrate including the inner surface of the trench.

According to a second embodiment of the present invention, there is provided a method of manufacturing a semiconductor device, comprising the steps of forming a trench in a semiconductor substrate, forming a first film on the surface of the semiconductor substrate including an inner surface of the trench so as to have a small thickness on an upper corner portion of a side surface of the trench, and to have a large thickness on a bottom corner portion of the trench, etching an entire surface of the first film to entirely or partially remove the first film, forming a second film on the surface of the semiconductor substrate including the inner surface of the trench so as to have a large thickness on an upper portion of the side surface of the trench, and to have a small thickness on a bottom portion of the trench, selectively doping an impurity in the bottom portion of the trench through a thin portion of the second film formed on the bottom portion of the trench to form an impurity region in the bottom portion of the trench, removing the second film, and forming a third film having an insulating property on the surface of the semiconductor substrate including the inner surface of the trench.

According to a third embodiment of the present invention, there is provided a method of manufacturing a semiconductor device, comprising the steps of forming a trench in a semiconductor substrate, forming a first film on the surface of the semiconductor substrate including an inner surface of the trench so as to have a small thickness on an upper corner portion of a side surface of the trench, and to have a large thickness on a bottom corner portion of the trench, etching an entire surface of the first film to entirely or partially remove the first film, and forming a second film having an insulating property on the surface of the semiconductor substrate including the inner surface of the trench.

According to the first to third embodiments of the present invention, there can be obtained a semiconductor device which can control dislocation caused by concentration of stress at a corner portion of the trench, thereby preventing an increase in leak current of an element and a decrease in breakdown voltage. In addition, according to the first and second embodiments of the present invention as described above, there can be obtained a semiconductor device which can prevent doping of an impurity in the side wall of the trench when an inversion preventive layer is formed by doping of the impurity in a bottom portion of the trench, thereby preventing an increase in leak current of an element and a decrease in breakdown voltage.

DETAILED DESCRIPTION OF THE PREFERRED EMBODIMENTS

In first and second embodiments of the present invention, a film is formed on a surface of a semiconductor substrate so as to have a large thickness on an upper portion of a side surface of a trench and to have a small thickness on a bottom portion of the trench. An impurity is selectively doped in the bottom portion of the trench through the thin film portion formed on the bottom portion of this trench.

The film having a large thickness on the upper portion of the side surface of the trench, and having a small thickness on the trench bottom portion can be formed by deposition of $SiO_2$, e.g., by normal pressure CVD or low pressure CVD. An aluminum, W, Mo or $SiO_2$ film which is formed by sputtering can be used as another film.

After an impurity is selectively doped in the bottom portion of the trench, the above film is removed, and an insulating film is formed on the inner surface of the trench. A thermal oxide film, a CVD $SiO_2$ film, a CVD $Si_3N_4$ film, a CVD PSG (phospho-silicate glass) film, a CVD $Al_2O_3$ film, a sputtered $SiO_2$ film, a sputtered $Al_2O_3$ film or the like can be used as the insulating film.

The trench in which the insulating film is formed on the inner surface may be buried by a dielectric or conductive material. By burying the trench with the conductive material, a capacitor and an interconnection electrode can be formed. Polycrystalline silicon, amorphous silicon, $Si_3N_4$, $Al_2O_3$, PSG, and the like can be used as the dielectric material, and impurity-doped polycrystalline silicon, tungsten silicide, molybdenum silicide, or the like can be used as the conductive material.

When $SiO_2$ is deposited on the entire surface of the semiconductor substrate having the trench by normal pressure CVD to form an $SiO_2$ film having a thickness of 5,000 Å on a flat portion of the substrate, the thickness of the film on the bottom portion of the trench having a depth of 4 to 6 $\mu$m is about 1,000 Å.

By forming such a film, it becomes unnecessary to perform a thermal oxidation step and to form a mask having viscosity and thermal expansion coefficient different from those of the other layers. As a result, no concentration of stress at a corner portion of the trench is present. Furthermore, doping of an impurity in side walls of the trench can be prevented by a simple process.

When a high-temperature thermal oxidation step becomes unnecessary in manufacturing step of the element isolation as described above, a change in impurity concentration distribution of an impurity diffusion layer such as an already formed buried layer having a high impurity concentration can be prevented. This allows formation of thin epitaxial layer having an advantage in a high-speed operation of the device. In addition, since a formation step of an ion implantation mask on the side surface of the trench is unnecessary, the process can be simple.

According to second and third embodiments of the present invention, a film is formed on the surface of the semiconductor substrate having a trench so as to have a small thickness on the upper corner portion of the side surface of the trench, and to have a large thickness on the bottom corner portion of the trench. As a result, the corner portions of the trench are rounded. In this state, when isotropic etching such as chemical dry or wet etching is performed for the film, roundness of the corner portions of the trench is maintained. In this case, all the film may be removed by over-etching, or a part of the film may remain in the bottom corner portions of the trench.

The film having a small thickness on the upper corner portion of the side surface of the trench, and having a large thickness on the bottom corner portion of the trench can be formed by CVD or sputtering. A film material may be selected from materials which can form a film having a uniform thickness on the substrate surface and the inner surface of the trench and which has an etching rate equal to or lower than that of the substrate. For example, a film formed made of polycrystalline silicon, silicon dioxide, aluminum, tungsten, molybdenum, or the like by CVD or sputtering is available.

The thickness of the film preferably falls within the range of tens to thousands Å.

Thus, by rounding the corner portions of the trench, concentration of the stress on the corner portion which occurs in the following annealing process can be controlled. When an insulating film is formed on the inner surface of the trench in the following process by thermal oxidation, its oxidizing temperature can be a temperature or less for allowing an oxide film to exhibit a viscoelasticity. Because, since the corner portions are rounded, the thickness of the oxide film of the corner portion is equal to the thickness of the oxide film of other portions, thus reducing the stress.

The insulating film can be formed on the inner surface of the trench by CVD which can form films at low temperatures. Because, since the corner portions are rounded, CVD having good step coverage can be applied, thus reducing the stress.

Since corner portions are rounded, when the insulating film is formed on the inner surface of the trench by thermal oxidation, its thickness can be selected within the wide range of several ten Å to 1 μm. Therefore, the present invention can be applied to manufacture of a trench capacitor for dynamic RAM (random access memory).

Note that, when the corner portion of the trench bottom is already rounded, it is apparent that only the upper corner portion of the trench may be rounded.

Various examples for illustrating the present invention will be described below.

EXAMPLE 1

Figure 2A:
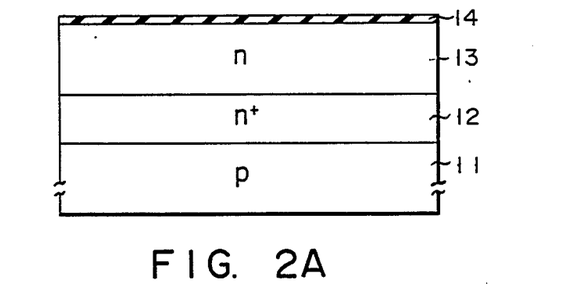
FIGS. 2A to 2D are sectional views showing an element isolation process according to one embodiment of the present invention.
Figure 2B:
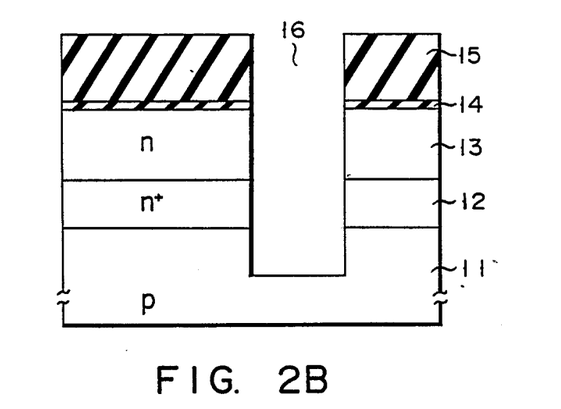
Figure 2C:
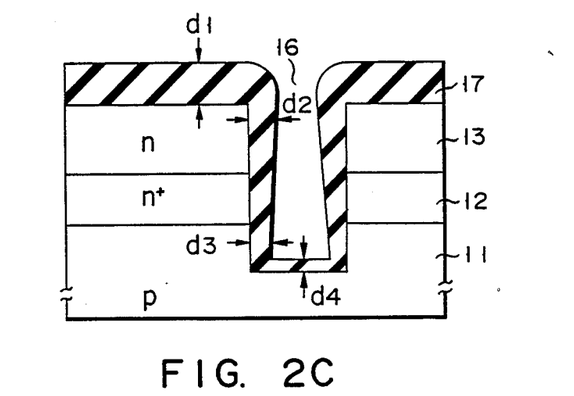
Figure 2D:
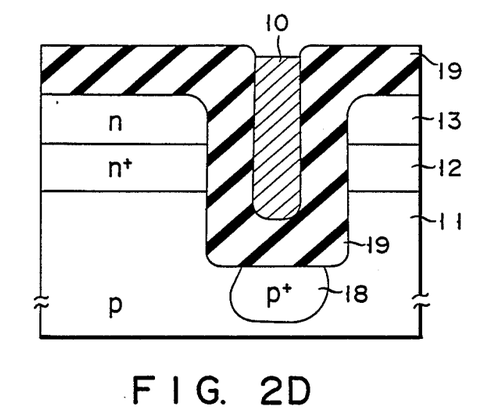

FIGS. 2A to 2D show an element isolation process according to an embodiment of the present invention. $N^+$-type buried layer 12 is formed in the surface region of p-type Si substrate 11 by diffusion of an n-type impurity. Then, n-type layer 13 serving as a collector layer is epitaxially grown to prepare a wafer. Thin $SiO_2$ film 14 (thickness: 1,000 Å) is formed on the surface of the wafer by thermal oxidation (FIG. 2A). Thick $SiO_2$ film 15 (thickness: 8,000 Å) is deposited on the surface of $SiO_2$ film 14 by CVD. Then, an opening is formed in an element isolation region of $SiO_2$ films 14 and 15 by etching using a resist pattern as a mask to expose the underlying substrate. Element isolation trench 16 having a depth of about 4 μm and a width of about 1.4 μm which reaches p-type Si substrate 11 is formed in the wafer by reactive ion etching using $SiO_2$ films 14 and 15 as masks (FIG. 2B). After trench 16 is formed, CVD-$SiO_2$ film 15 and thermal oxide film 14 used as masks are etched by an $NH_4F$ aqueous solution. At the same time, a polymer attached to the inner surface of trench 16 is also removed by this solution. Thereafter, $SiO_2$ film 17 is deposited on the entire surface of the exposed substrate including the inner surface of the trench by normal pressure CVD at a substrate temperature of 40° C. (FIG. 2C). When $SiO_2$ film 17 obtained at this time has a thickness of $d_1=5,000$ Å on the flat surface of the substrate, $d_2=5,000$ Å on the upper portion of the side wall of trench 16, $d_3=2,000$ Å on the lower portion of the side wall of trench 16, and $d_4=1,000$ Å on the bottom of trench 16. Note that, prior to formation of normal pressure CVD-$SiO_2$ film 17, a thin thermal oxide film may be formed on the entire surface of the substrate. Then, boron ions are selectively implanted in the bottom portion of trench 16 utilizing a difference between the thicknesses of the portions of this $SiO_2$ film 17, thereby forming $p^+$-type layer 18. For example, $p^+$-type layer 18 can be formed on only the bottom portion of trench 16, when a dose is $10^{14}$ ions/cm$^2$, and an accelerating voltage is 40 keV. Thereafter, $SiO_2$ film 17 is removed, and another $SiO_2$ film 19 (thickness of film: 5,000 Å) is formed by thermal oxidation. Then, after polycrystalline silicon is deposited on the entire surface by CVD, the entire surface may be etched-back by anisotropic etching Thus, polycrystalline silicon layer 10 is buried in the inner space of the trench (FIG. 2D). The polycrystalline silicon layer is used as buried dielectrics because the same material as in the substrate is used so that unnecessary stress due to a difference between thermal expansion coefficients can be effectively prevented.

Thereafter, although not shown, an $SiO_2$ film is formed on the surface of polycrystalline layer 10 in the trench to complete isolation. A transistor having n-type layer 13 as a collector is formed on the element region isolated by the trench according to the conventional method, thus obtaining a bipolar integrated circuit.

According to this embodiment, since an ion-implantation resistive mask upon ion-implantation in the trench bottom portion is a normal pressure CVD-$SiO_2$ film consisting of one layer, stress is not concentrated at the trench corner portions, unlike the conventional case. Therefore, dislocation is suppressed and unnecessary impurity doping in the trench side wall can be prevented. In addition, as a result of a decrease in the number of thermal steps, rediffusion of the impurity in a buried diffusion layer can be prevented. Therefore, e.g., in a bipolar integrated circuit, a thin epitaxial layer can be advantageously realized for high-speed operation. As a result, a high-performance semiconductor integrated circuit having excellent characteristics such as high-frequency and junction characteristics can be obtained. In addition, its element isolation process is simple as compared to the conventional method.

In the above embodiment, although normal pressure CVD is utilized as a method of forming a film having a small thickness on the trench bottom portion, other methods for forming a film having different thicknesses by one step as in the above method can be supplied. For example, an $SiO_2$ film is deposited by CVD using saline gas and oxygen, so that the film having a small thickness on the trench bottom portion as compared with the other portion can be formed. More specifically, when an $SiO_2$ film is deposited by low pressure CVD having a pressure of 0.1 torr at a substrate temperature of 400° C., a desired film can be obtained. The film having a small thickness on the trench bottom portion can be formed by sputtering. For example, an $SiO_2$ film or an Al film is deposited by sputtering under the condition that a substrate temperature is 200° C., a pressure is $3 \times 10^{-1}$ Pa, and a power is 6 kW. A film having a small thickness on the trench bottom portion can be obtained.

EXAMPLE 2

Figure 3A:
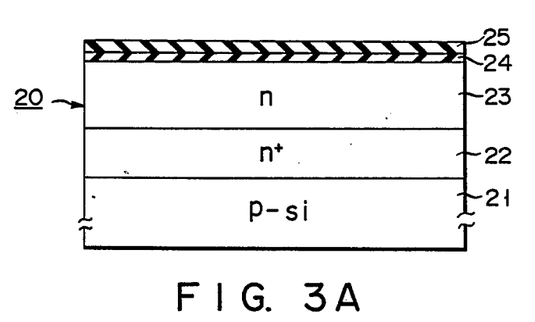
FIGS. 3A to 3F are sectional views showing an element isolation process according to another embodiment of the present invention.
Figure 3B:
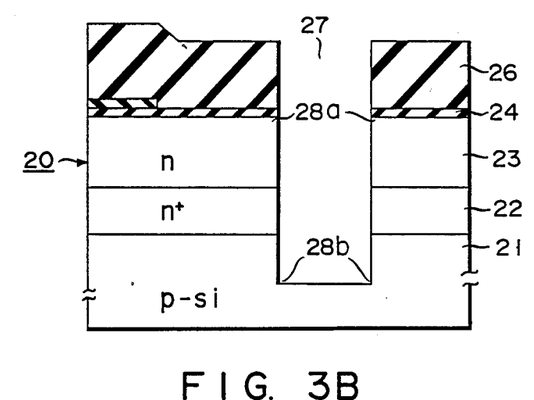

FIGS. 3A to 3F are sectional views showing formation of element isolation according to the second embodiment of the present invention. In this embodiment, a countermeasure for preventing dislocation at corner portions of the element isolation trench is considered as compared to the above embodiment. As shown in FIG. 3A, n+-type buried layer 22 is formed on p-type Si substrate 21, as in Example 1. Then, n-type epitaxial layer 23 serving as a collector layer is formed. Subsequently, the surface of layer 23 is oxidized to form $SiO_2$ film 24, and $Si_3N_4$ film 25 is formed thereon by CVD. Substrate 20 including substrate 21, n+-type buried layer 22, and n-type epitaxial layer 23 will be referred to as underlying substrate 20 hereinafter. Thereafter, $Si_3N_4$ film 25 is patterned and $SiO_2$ film 26 is deposited on the surface of film 25 by CVD, as shown in FIG. 3B. Then, $SiO_2$ films 26 and 24 are partially etched to expose the surface of underlying substrate 20. Thereafter, underlying substrate 20 is etched through an opening by RIE using remaining CVD-$SiO_2$ film 26 as a mask to form element isolation trench 27. This trench 27 has a depth which sufficiently reaches substrate 21 through n+-type buried layer 22. Note that, in this state, upper and bottom corner portions 28a and 28b formed on underlying substrate 20 are sharp.

CVD-$SiO_2$ film 26 serving as a mask material and $SiO_2$ film 24 formed thereunder are etched by an $NH_4F$ aqueous solution to expose the surface of patterned $Si_3N_4$ film 25 and underlying substrate 20.

Figure 3C:
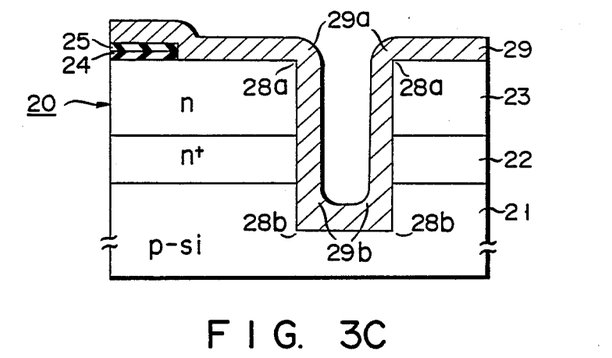

As shown in FIG. 3C, polycrystalline silicon film 29 serving as a first film is deposited on the entire surface of underlying substrate 20 including trench 27 by CVD. In this polycrystalline silicon film 29 formed by CVD, portion 29a on upper corner portion 28a of trench 27 has a small thickness, and portion 29b on lower corner portion 28b of trench 27 has a large thickness. Therefore, in the surface of trench 27 covered with polycrystalline silicon film 29, four corner portions are rounded.

Figure 3D:
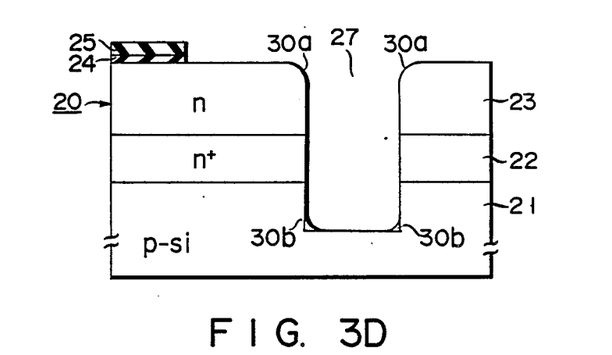

As shown in FIG. 3D, polycrystalline silicon film 29 is etched by isotropic etching such as CDE to expose the surface of underlying substrate 20 and trench 27. At this time, in upper corner portion 28a of trench 27, since the thickness of polycrystalline silicon film 29 is thin, substrate etching is started in the early stage. Therefore, upper corner portion 30a of element isolation trench 27 can be rounded. On the other hand, since polycrystalline silicon film 29b on bottom corner portion 28b of trench 27 is thick, substrate etching is started with a delay. Therefore, bottom corner portion 30b can also be rounded. In this bottom corner portion 30b, even if polycrystalline silicon film 29 is etched so as to partially remain, the same round shape can be obtained as in the above case.

Figure 3E:
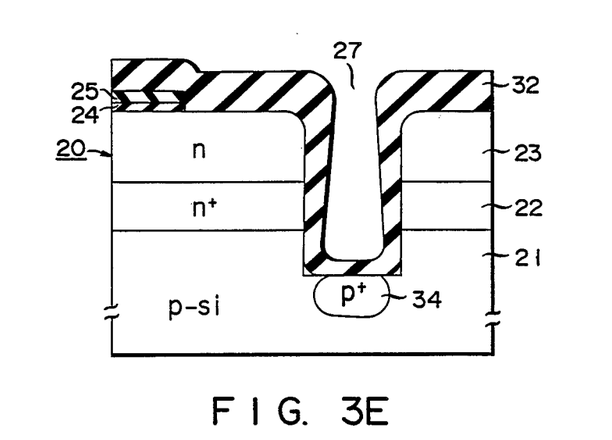

As shown in FIG. 3E, $SiO_2$ film 32 is deposited on the entire surface of the exposed substrate by normal pressure CVD. Therefore, a mask material having a large thickness on the upper portion and having a small thickness on the bottom portion of trench 27 can be obtained. Boron ions are selectively implanted in the bottom portion of trench 27 utilizing a difference in thicknesses between upper and bottom portions of $SiO_2$ film 32 form p+-type layer 34. Thereafter, $SiO_2$ film 32 is removed without removing the polycrystalline silicon film on bottom corner portions 30b of trench 27.

Figure 3F:
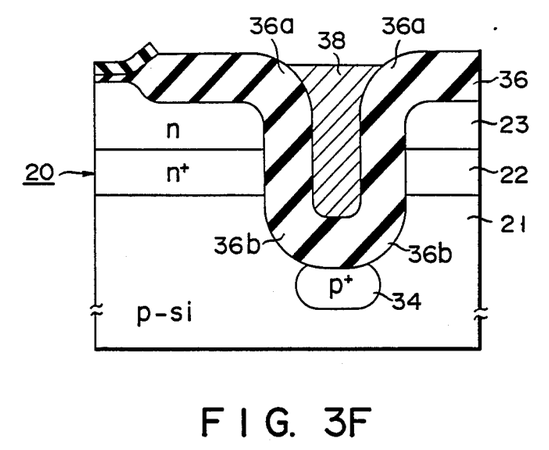

As shown in FIG. 3F, $SiO_2$ film 36 serving as a second film is formed on the entire surface of underlying substrate 20 including trench 27 using $Si_3N_4$ film 25 as an anti-oxidation mask by thermal oxidation. At this time, since corner portions 30a and 30b of trench 27 are rounded, the thicknesses of the oxide film portions on portions 30a and 30b are equal to those on the trench side surface and the trench bottom surface. Therefore, stress on the trench corner portions can be reduced, thus preventing dislocation. In addition, this oxidation can be also performed at 965° C. or less.

Polycrystalline silicon film 38 is deposited on the substrate surface including trench 27, and the deposited film is completely buried in trench 27. Thereafter, polycrystalline silicon film 38 on the flat portion is etched back and removed, and film 38 remains only on the trench portion. Thereafter, an $SiO_2$ film (not shown) having a thickness of about 500 Å is formed on the surface of polycrystalline silicon film 38 on the trench portion by thermal oxidation. Then, $Si_3N_4$ film 25 and underlying $SiO_2$ film 24 are etched, thus achieving insulative isolation.

According to this embodiment, by formation and etching of polycrystalline silicon film 29, the corner portions of element isolation trench 27 can be effectively rounded. Therefore, stress concentrated at the corner portions in the following annealing can be reduced. Therefore, the thermal oxide film ($SiO_2$ film in trench isolation can be formed at a low temperature, thus preventing dislocation and undesirable diffusion of an impurity in the buried layer. This effect causes improvements of high-frequency and junction characteristics in a bipolar semiconductor device, and the like.

EXAMPLE 3

Figure 4:
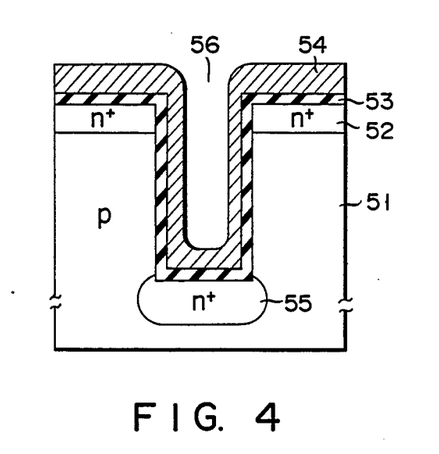
FIG. 4 is a sectional view showing a trench transistor obtained by a method according to the present invention.

FIG. 4 is a sectional view of a finished MOS trench transistor according to the present invention. This will be briefly described below in accordance with manufacturing steps. N+-type layer 52 is formed on p-type Si substrate 51 and a mask material is deposited thereon. Then, trench 56 is formed by photoengraving and the mask material is removed by etching. Subsequently, e.g., a normal pressure CVD-$SiO_2$ film having a large thickness on the substrate surface and the trench side surface portion, and having a small thickness on the trench bottom portion is formed. Then, ions are implanted using this $SiO_2$ film as a mask to form n+-type layer 55, and this $SiO_2$ film is removed thereafter. $SiO_2$ film 54 serving as a gate insulating film is formed by thermal oxidation, and n+-type polycrystalline silicon film 54 is deposited thereon, thus obtaining a transistor.

When this transistor and a trench capacitor are combined, a dRAM having a very small size can be obtained.

EXAMPLE 4

Figure 5A:
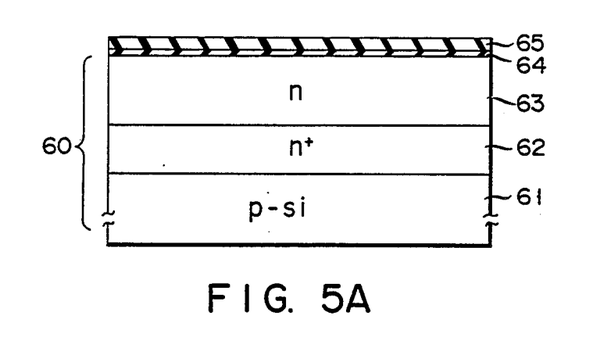
FIGS. 5A to 5E are sectional views showing an element isolation process according to still another embodiment of the present invention.

FIGS. 5A to 5E are sectional views showing manufacturing processes of a semiconductor device according to the present invention. First, as shown in FIG. 5A, n+-type buried layer 62 is formed in the surface of p-type Si substrate 61, and n-type epitaxial layer 63 serving as a collector layer is formed on n+-type buried layer 62. Then, the surface of film 63 is oxidized to form $SiO_2$ film 64, and $Si_3N_4$ film 65 is formed thereon by CVD. Semiconductor substrate 60 comprises Si substrate 61, n+-type buried layer 62, and n-type epitaxial layer 63.

Figure 5B:
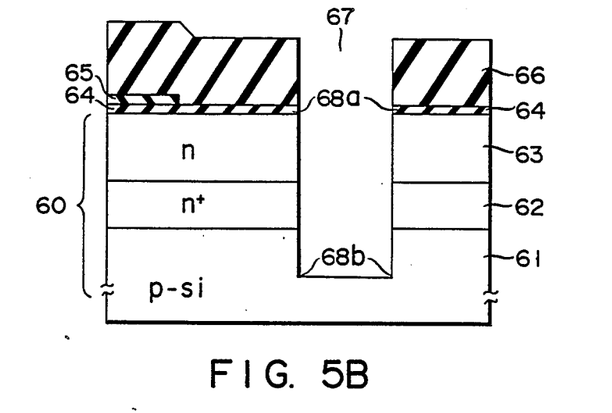

After $Si_3N_4$ film 65 is patterned, as shown in FIG. 5B, $SiO_2$ film 66 is deposited on the entire surface of patterned film 65 by CVD. Then, CVD-$SiO_2$ film 66 and thermal oxidized SiO$_2$ film 64 are partially etched to expose the surface of underlying substrate 60. Thereafter, underlying substrate 60 is etched through an opening by RIE using remaining CVD-SiO$_2$ film 66 as a mask to form element isolation trench 67. This trench 67 has a depth which sufficiently reaches Si substrate 61 through n$^+$-type buried layer 62. Boron Ions are implanted in the bottom portion of trench 67 in order to prevent inversion. Note that, in this state, upper and bottom corner portions 68a and 68b of trench 67 formed in underlying substrate 60 are sharp.

CVD-SiO$_2$ film 66 serving as a mask material and SiO$_2$ film 64 formed thereunder are etched by an NH$_4$F aqueous solution or the like to expose the surface of patterned Si$_3$N$_4$ film 65 and substrate 60.

Figure 5C:
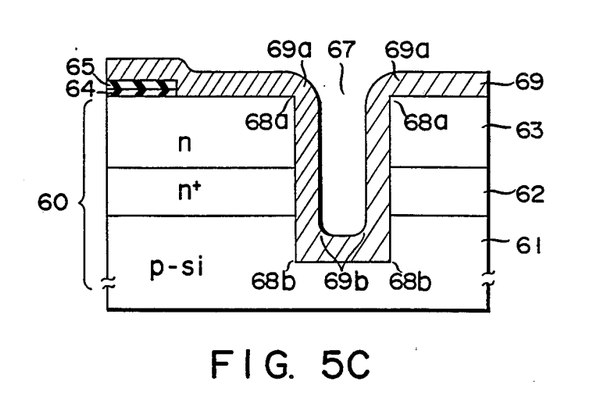

As shown in FIG. 5C, polycrystalline silicon film 69 serving as a first film is deposited on the entire surface of substrate 60 including the inner surface of trench 67 by CVD. In this polycrystalline silicon film 69 formed by CVD, portion 69a on upper corner portion 68a of trench 67 has a small thickness, and portion 69b on lower corner portion 68b of trench 67 has a large thickness. Therefore, in the surface of trench 67 covered with polycrystalline silicon film 69, four corner portions are rounded.

Figure 5D:
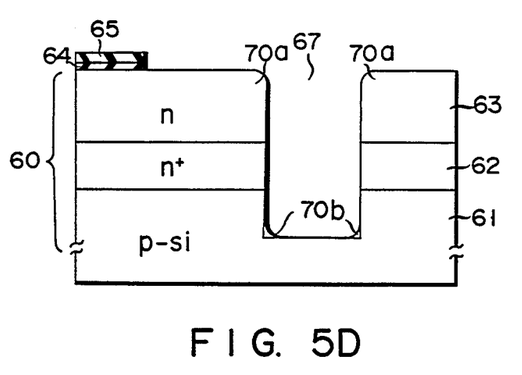

As shown in FIG. 5D, polycrystalline silicon film 69 is etched by isotropic etching such as CDE (chemical dry etching) to expose the surfaces of substrate 60 and trench 67. At this time, in the upper portion of trench 67, since the thickness of polycrystalline silicon film 69a on upper corner portion 68a is thin, substrate etching for corner portion 68a is started in the early stage. Therefore, upper corner portion 70a of element isolation trench 67 can be rounded.

On the other hand, in the bottom portion of trench 67, since polycrystalline silicon film 69b on bottom corner portion 68b is thick, substrate etching for corner portion 68b is started with a delay. Therefore, bottom corner portion 70b of element isolation trench 67 can be rounded. In this bottom corner portion 70b, even if polycrystalline silicon film 69 is etched so as to partially remain, the same round shape as in the above case can be obtained.

Figure 5E:
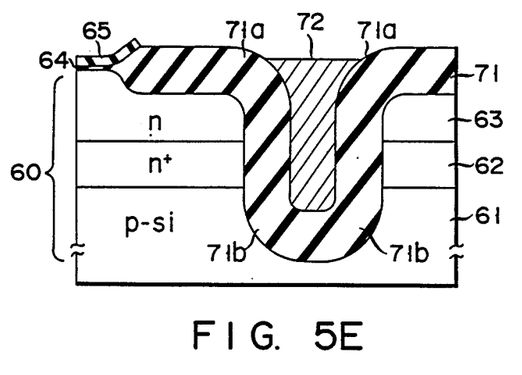

As shown in FIG. 5E, SiO$_2$ film (a second film) 71 is formed on the entire surface of substrate 60 including the inner surface of trench 67 using Si$_3$N$_4$ film 65 serving as an anti-oxidation mask by thermal oxidation. At this time, since both corner portions 70a and 70b are rounded, the oxide film thicknesses of these portions 71a and 71b are equal to those of the substrate surface, trench side surface, and trench bottom surface. Therefore, stress on the corner portions can be reduced, thus preventing dislocation. In addition, this oxidation can be performed at 965° C. or less.

Polycrystalline silicon film 72 is formed on the substrate surface including trench 67, and the deposited film is completely buried in trench 67. Thereafter, polycrystalline silicon film 72 on the flat portion is etched back and removed, and film 72 remains only on the trench portion. Thereafter, an SiO$_2$ film (not shown) having a thickness of about 500 Å is formed on the surface of polycrystalline silicon film 72 on the trench portion by thermal oxidation. Then, Si$_3$N$_4$ film 65 and underlying SiO$_2$ film 64 are etched, thus achieving insulative isolation.

According to this embodiment, by formation and etching of polycrystalline silicon film 69, the corner portions 70a and 70b of element isolation trench 67 can be effectively rounded. Therefore, stress concentrated at the corner portion in the following annealing process can be reduced. Therefore, the thermal oxide film (SiO$_2$ film 71) in trench isolation can be formed at a low temperature, thus preventing dislocation and undesirable diffusion of an impurity in the buried layer. This effect causes improvements of high-frequency and junction characteristics in a bipolar semiconductor device, and the like.

EXAMPLE 5

Figure 6:
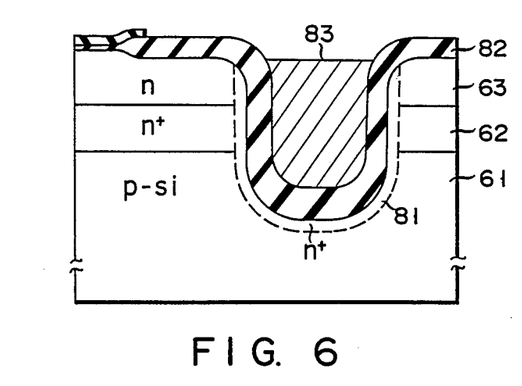
FIG. 6 is a sectional view showing a trench capacitor obtained by a method according to the present invention.

FIG. 6 is a sectional view showing a trench capacitor obtained by the process similar to that shown in Example 4.

In this case, an n$^+$-type region 81 is formed in the inner surface of the trench, and SiO$_2$ film 82 (thickness: 100 Å) having a smaller thickness than that of SiO$_2$ film 71 as in Example 4 is formed by thermal oxidation. In addition, a conductive material such as polycrystalline silicon layer 83 containing an impurity is buried in the trench. This polycrystalline silicon layer 83 is used as an electrode of a capacitor. Note that, when isolation between the elements is performed, in the structure shown in FIG. 6, a p$^+$-type region must be formed in the bottom portion of the trench.

What is claimed is:

1. A method of manufacturing a semiconductor device, comprising the steps of forming a trench in a semiconductor substrate, forming a first film on the surface of said semiconductor substrate including an inner surface of siad trench so as to have a large thickness on the surface of said semiconductor substrate and on an upper portion of a side surface of said trench and to have a small thickness on a bottom portion of said trench, selectively doping an impurity in the bottom portion of said trench through a thin portion of the first film formed on the bottom portion of said trench to form an impurity region on the bottom portion of said trench, removing said first film, and forming a second film having an insulating property on the surface of said semiconductor substrate including the inner surface of said trench.

2. A method according to claim 1, wherein the step of forming said first film is performed by deposition of SiO$_2$ by normal pressure CVD or low pressure CVD.

3. A method according to claim 1, wherein the step of forming said first film is performed by deposition of one member selected from the group consisting of W, Mo, Al and SiO$_2$ by sputtering.

4. A method according to claim 1, wherein said second film is selected from the group consisting of a thermal oxide film, a CVD SiO$_2$ film, a CVD Si$_3$N$_4$ film, a CVD PSG film, a CVD Al$_2$O$_3$ film, a sputtered SiO$_2$ film and a sputtered Al$_2$O$_3$ film.

5. A method according to claim 1, further comprising the step of burying a dielectric material or a conductive material in a trench in which said second film is formed on the inner surface.

6. A method according to claim 5, wherein said dielectric material is one selected from the group consisting of polycrystalline silicon, amorphous silicon Al$_2$O$_3$, SiO$_2$, Si$_3$N$_4$ and PSG.

7. A method according to claim 5, wherein said conductive material is one selected from the group consisting of polycrystalline silicon containing an impurity, tungsten silicide and molybdenum silicide.

8. A method of manufacturing a semiconductor device, comprising the steps of forming a trench in a semiconductor substrate, forming a first film on the surface of said semiconductor substrate including an inner surface of said trench so as to have a small thickness on an upper corner portion of a side surface of said trench, and to have a large thickness on a bottom corner portion of said trench, etching a surface of said first film to entirely or partially remove said first film, forming a second film on the surface of said semiconductor substrate so as to have a large thickness on an upper portion of the side surface of said trench, and to have a small thickness on a bottom portion of said trench selectively doping an impurity in the bottom portion of said trench through a thin portion of the second film formed on the bottom portion of said trench to form an impurity region in the bottom portion of said trench, removing said second film, and forming a third film having an insulating property on the surface of said semiconductor substrate including the inner surface of said trench.

9. A method according to claim 8, wherein the step of forming said first film is performed by deposition of a material selected from the group consisting of polycrystalline silicon, silicon dioxide, Al, W and Mo by CVD or sputtering.

10. A method according to claim 8, wherein the step of forming said second film is performed by deposition of $SiO_2$ by normal pressure CVD or low pressure CVD.

11. A method according to claim 8, wherein the step of forming said second film is performed by deposition of a material selected from the group consisting of $SiO_2$, Al, W and Mo by sputtering.

12. A method according to claim 8, wherein said third film is selected from the group consisting of a thermal oxide film, a CVD $SiO_2$ film, a CVD $Si_3N_4$ film, a CVD PSG film, a CVD $Al_2O_3$ film, a sputtered $SiO_2$ film and a sputtered $Al_2O_3$ film.

13. A method according to claim 8, further comprising the step of burying a dielectric material or a conductive material in a trench in which said third film is formed on the inner surface.

14. A method according to claim 13, wherein said dielectric material is selected from the group consisting of polycrystalline silicon, amorphous silicon, $SiO_2$, $Si_3N_4$, $Al_2O_3$ and PSG.

15. A method according to claim 13, wherein said conductive material is selected from the group consisting of polycrystalline silicon containing an impurity, tungsten silicide, and molybdenum silicide.

16. A method of manufacturing a semiconductor device, comprising the steps of forming a trench on a semiconductor substrate, forming a first film on the surface of said semiconductor substrate including an inner surface of said trench so as to have a small thickness on an upper corner portion of a side surface of said trench, and to have a large thickness on a bottom corner portion of said trench, etching a surface of said first film entirely or partially to remove said first film, and forming a second film having an insulating property on the surface of said semiconductor substrate including the inner surface of said trench.

17. A method according to claim 16, wherein the step of forming said first film is performed by deposition of a material selected from the group consisting of polycrystalline silicon, Al, W and Mo by CVD or sputtering.

18. A method according to claim 16, wherein said second film is selected from the group consisting of a thermal oxide film, a CVD $SiO_2$ film, a CVD $Si_3N_4$ film, a CVD PSG film, a CVD $Al_2O_3$ film, a sputtered $SiO_2$ film and a sputtered $Al_2O_3$ film.

19. A method according to claim 16, further comprising the step of burying a dielectric material or a conductive material in a trench in which said second film is formed on the inner surface.

* * * * *